United States Patent
Kinkade et al.

(10) Patent No.: US 8,218,391 B2
(45) Date of Patent: Jul. 10, 2012

(54) POWER CONTROL OF AN INTEGRATED CIRCUIT MEMORY

(75) Inventors: Martin Jay Kinkade, Austin, TX (US); Gus Yeung, Austin, TX (US); Yew Keong Chong, Austin, TX (US)

(73) Assignee: ARM Limited, Cambridge (GB)

( * ) Notice: Subject to any disclaimer, the term of this patent is extended or adjusted under 35 U.S.C. 154(b) by 188 days.

(21) Appl. No.: 12/801,925

(22) Filed: Jul. 1, 2010

(65) Prior Publication Data
US 2012/0002499 A1     Jan. 5, 2012

(51) Int. Cl.
*G11C 5/14*     (2006.01)
(52) U.S. Cl. ............... 365/227; 365/233.1; 365/233.14
(58) Field of Classification Search ............... 365/227, 365/233.1, 233.14, 230.06
See application file for complete search history.

(56) References Cited

U.S. PATENT DOCUMENTS

| | | | |
|---|---|---|---|
| 4,906,862 A | | 3/1990 | Itano et al. |
| 6,366,522 B1 * | | 4/2002 | May et al. ..................... 365/227 |
| 6,711,090 B2 * | | 3/2004 | Fujimori .................. 365/189.15 |

* cited by examiner

*Primary Examiner* — Son Dinh
(74) *Attorney, Agent, or Firm* — Nixon & Vanderhye P.C.

(57) ABSTRACT

An integrated circuit memory 10, 12 has clock control circuitry 36 responsive to a clock signal CLK and a chip enable signal CEN to generate control signals for controlling the integrated circuit memory 10 in response to the clock signal CLK when the chip enable signal CEN indicates that the integrated circuit memory 10, 12 is active. When the chip enable signal CEN indicates that the integrated circuit memory 10, 12 is disabled, then power control circuitry 38 serve to switch portions of the integrated circuit memory 10, 12, such as word line driver circuitry 24, sense amplifiers 22 and buffer circuitry 30, into a low power state from an operating state. When the chip enable signal CEN activates the integrated circuit memory 10, 12, the power control circuitry 38 switches these portions 24, 22, 30 which are in the low power state back to the operating state.

15 Claims, 4 Drawing Sheets

Clock Control

Power Control

POWER CONTROL OF AN INTEGRATED CIRCUIT MEMORY

BACKGROUND OF THE INVENTION

1. Field of the Invention

This invention relates to integrated circuit memories. More particularly, this invention relates to power control within integrated circuit memories.

2. Description of the Prior Art

As process geometries decrease in size, the standby power consumed by memories has become a larger proportion of the total power consumed by the memory. Thus, even when the memory is not being read or written, power is consumed due to current leakage through the bit cells and the various circuits which are found within the memory and used to access the data values stored in the memory. It is known to apply power gating to word line drivers within an integrated circuit to reduce the power consumed. A known approach uses power gating enable inputs dedicated to controlling this power saving feature. This requires the user of the memory to apply appropriate inputs to the power gating enable inputs to switch the memory into the power saving mode. As a consequence, additional design and validation effort is needed by the user of the memory as well as appropriate mechanisms to control when the power saving feature is activated and deactivated.

SUMMARY OF THE INVENTION

Viewed from one aspect the present invention provides an integrated circuit memory comprising:

a clock signal input configured to receive a clock signal;

a chip enable signal input configured to receive a chip enable signal;

memory circuitry configured to store data values;

clock control circuitry coupled to said memory circuitry, said clock signal input and said chip enable signal input and configured such that:
  (i) when said chip enable signal has a first value, said clock control circuitry is responsive to said clock signal to generate one or more control signals for controlling an access operation for accessing one or more data values stored within said memory circuitry; and
  (ii) when said chip enable signal has a second value, said clock control circuitry blocks generation of said one or more control signals in response to said clock signal; and power control circuitry coupled to said memory circuitry and said chip enable signal input and configured such that:
  (i) when said chip enable signal has said second value, said power control circuitry controls power supply circuitry of at least a portion of said memory circuitry to switch said portion of said memory circuitry to a low power state in which said portion of said memory circuitry is not able to operate; and
  (ii) when said chip enable signal has said first value, said power control circuitry controls said power supply circuitry of said portion of said memory circuitry to switch said portion of said memory circuitry to an operating state in which said portion of said memory circuitry is able to operate and having a higher power consumption than said low power state.

The present technique recognizes that an integrated circuit memory is normally controlled with a chip enable signal which serves to enable and disable memory accesses (which can be either read accesses or write accesses) to the integrated circuit memory. When the chip enable signal is enabling accesses, a clock signal received by the memory will result in the generation of one of more control signals which control the various parts of the memory to conduct the desired memory access. Conversely, when the clock enable signal is disabling the memory, a received clock signal will not result in generation of control signals for controlling a memory access and no memory access will be performed. The present technique recognizes that this chip enable signal can be used to also control power gating applied to part or all of the memory so as to switch the memory between an operating state and a low power state. If the chip enable signal is disabling memory accesses and rendering the memory non-responsive to a received clock signal, then part or all of the memory circuit may safely be switched into a low power state and so reduce the power consumed by the memory while data values stored within the memory are retained. When the chip enable signal switches to enable memory accesses, the portions of the memory which have been placed into the low power state may be switched into the operating state. The setup time associated with the chip enable signal can effectively be reused to provide all or at least part of the time required to switch from the low power state to the operating state. This technique allows the normal chip enable signal to transparently control power gating of part or all of the memory in a way which frees the user from having to design, validate or control this power gating functionality when incorporating the memory into a system design which already provides the chip enable signal.

It will be appreciated that, as mentioned above, different portions of the memory circuitry may be switched into the low power state under control of the chip enable signal. It is possible that the whole of the memory circuitry may be switched into a low power state with only those portions of the memory circuitry required to maintain the data values stored therein remaining powered. However, it is desirable not to unduly increase the setup time associated with the chip enable signal and accordingly reusing the chip enable signal to control the switching between a low power state and operating state may be performed with particular advantage in respect of portions of the integrated circuit which can switch rapidly between the low power state and the operating state. Examples of such portions of the integrated circuit memory which can be rapidly switched between the low power state and the operating state include word line driver circuitry that generates word line signals for controlling access to rows of bit cells within an array of bit cells and/or sense amplifiers for reading data values from bit lines extending through an array of bit cells. Further examples of portions of the integrated circuit memory which may be controlled without unduly increasing the setup time (delay) associated with the chip enable signal include column multiplexing circuitry, data buffers, address decoders and data path control circuits. The present technique may be used with various combinations and sub-combinations of these portions of the integrated circuit being switched between the low power state and the operating state in dependence upon the chip enable signal.

When the chip enable signal is disabling the memory circuitry, a memory circuitry will normally be non-responsive to address signals specifying a memory address to be accessed as well as transaction control signals specifying an access operation to be performed. It is often the case that a bus carrying address signals and transaction signals may be shared between multiple memories and the chip enable signal used to control which of those memories at any given time is responsive to the address signals and the transaction signals.

The low power state could reduce power consumption in a variety of different ways. One particular use of the present technique is where the low power state is used to control switching a portion of the memory circuit into a state having a lower power leakage than when that portion of the memory circuitry is in the operating state.

The power supply circuitry which is controlled by the power control circuitry may take a variety of different forms. For example, body biasing techniques might be used in relation to certain portions of the memory. However, one convenient way of implementing the present techniques is to use at least one of header gates coupled to a first power rail and footer gates coupled to a second power rail to control the supply of power to the portion of the memory circuitry disposed between these power rails and drawing power therefrom. Different embodiments may use only headers, only footers or both headers and footers.

As previously mentioned, it is desirable that the time taken to switch between the low power state and the operating state should be at least partially hidden within the setup time of the chip enable signal. If this time taken to switch between the low power state and the operating state extends the chip enable setup time, then this may be readily tolerated given the power saving advantages achieved in embodiments in which the extension to the chip enable signal is less than thirty percent. Beyond this level of extension of the chip enable setup time, the loss in performance of the memory comes to outweigh the advantages associated with the transparent power saving control achieved using the present techniques.

Viewed from another aspect the present invention provides an integrated circuit memory comprising:
clock signal input means for receiving a clock signal;
chip enable signal input means for receiving a chip enable signal;
memory means for storing data values;
clock control means for generating one or more control signals and coupled to said memory means, said clock signal input means and said chip enable signal input means, wherein:
  (i) when said chip enable signal has a first value, said clock control means is responsive to said clock signal to generate said one or more control signals for controlling an access operation for accessing one or more data values stored within said memory means; and
  (ii) when said chip enable signal has a second value, said clock control means blocks generation of said one or more control signals in response to said clock signal; and
power control means for controlling a power supply to at least a portion of said memory means and coupled to said chip enable signal input means, wherein:
  (i) when said chip enable signal has said second value, said power control means controls said power supply to said portion of said memory means to switch said portion of said memory means to a low power state in which said portion of said memory means is not able to operate; and
  (ii) when said chip enable signal has said first value, said power control means controls said power supply of said portion of said memory means to switch said portion of said memory means to an operating state in which said portion of said memory means is able to operate and having a higher power consumption than said low power state.

Viewed from a further aspect the present invention provides a method of controlling an integrated circuit memory comprising the steps of:
receiving a clock signal;
receiving a chip enable signal;
storing data values within memory circuitry;
in response to said clock signal:
  (i) when said chip enable signal has a first value, generating one or more control signals for controlling an access operation for accessing one or more data values stored within said memory circuitry; and
  (ii) when said chip enable signal has a second value, blocking generation of said one or more control signals; and
controlling a power supply to at least a portion of said memory circuitry such that:
  (i) when said chip enable signal has said second value, switching said portion of said memory circuitry to a low power state in which said portion of said memory circuitry is not able to operate; and
  (ii) when said chip enable signal has said first value, switching said portion of said memory circuitry to an operating state in which said portion of said memory circuitry is able to operate and having a higher power consumption than said low power state.

The above, and other objects, features and advantages of this invention will be apparent from the following detailed description of illustrative embodiments which is to be read in connection with the accompanying drawings.

DESCRIPTION OF EMBODIMENTS

Figure 1:
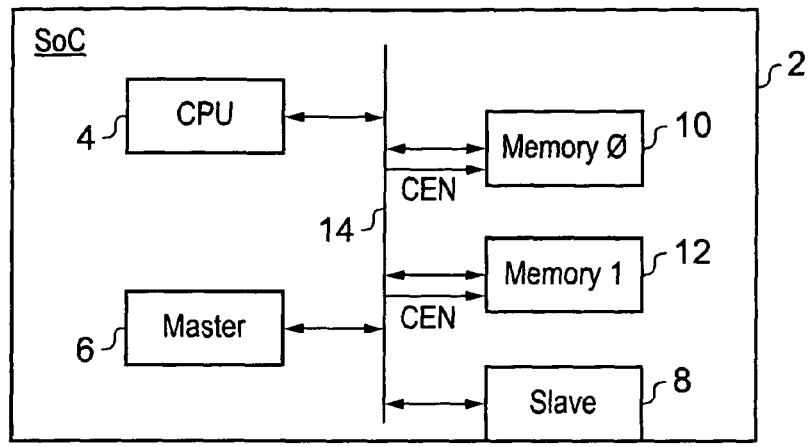
FIG. 1 schematically illustrates a system-on-chip integrated circuit including multiple integrated circuit memories.

FIG. 1 schematically illustrates a system-on-chip integrated circuit 2 including a processor core 4, a further transaction master 6, a slave circuit 8 and two integrated circuit memories 10, 12 all connected via a system bus 14. Memory transactions, which may be read or writes, are transferred via the system bus 14 to the memories 10, 12. A chip enable signal CEN (active low) is supplied from the system bus 14 to each of the memories 10, 12 to control which of the memories is responsive to the transaction asserted on the system bus 14. Thus, if the memory transaction is to access (either during a read or during a write) the memory 10, then the chip enable signal CEN will be used to select the memory 10 as active (CEN=0 supplied to memory 10) while the chip enable signal CEN supplied to the memory 12 will control this to be inactive (CEN=1 supplied to the memory 12). The generation and use of these chip enable signals CEN will be familiar to those in this technical field.

Figure 2:
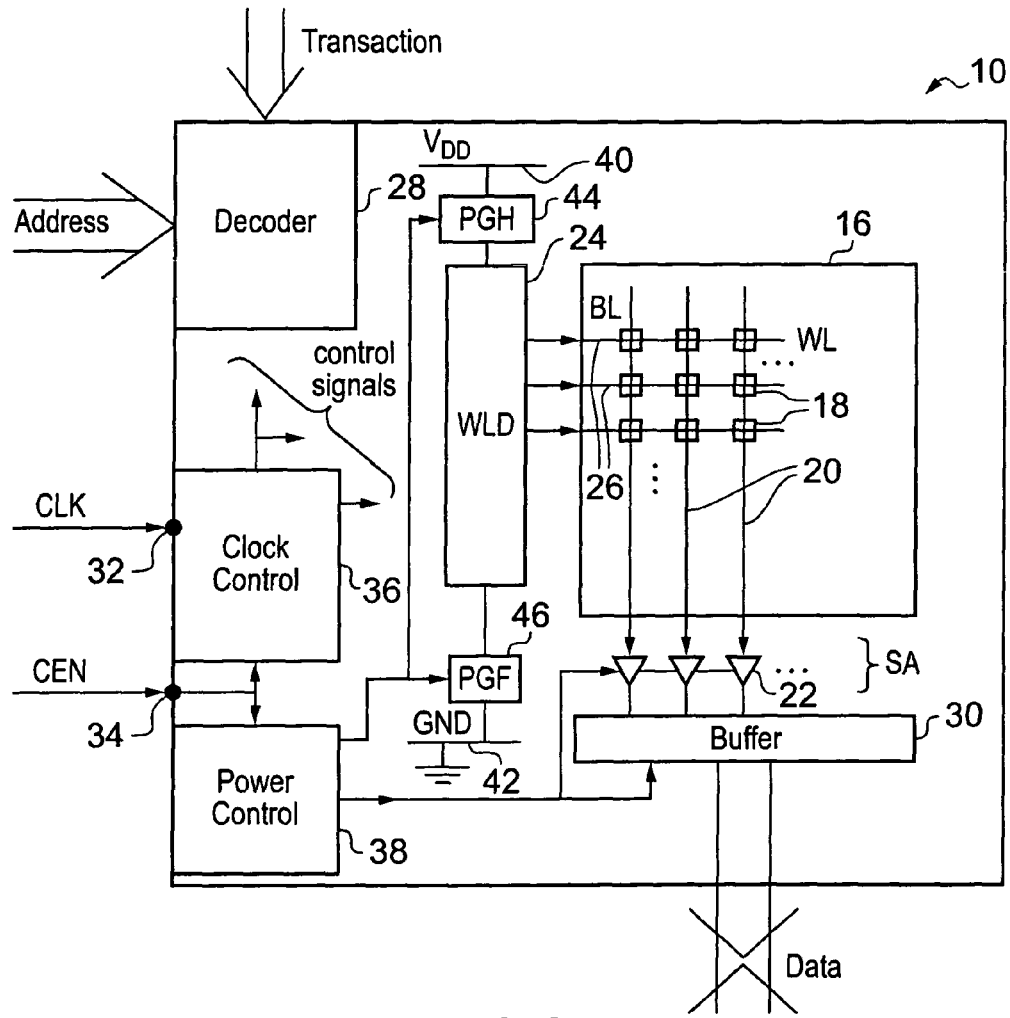
FIG. 2 schematically illustrates an integrated circuit memory including a power controller controlled by a chip enable signal.

FIG. 2 schematically illustrates the integrated circuit memory 10 which forms part of the system-on-chip integrated circuit 2. The integrated circuit memory 10 includes an array 16 of bit cells 18 storing data values. Columns of these bit cells 18 are accessed with bit lines 20 coupled to sense amplifiers 22 (active upon a read). Word line driver circuitry 24 generates word line signals on word lines 26 to select a row of bit cells 18 to be accessed. An address decoder 28 is responsive to received address signals and received transaction signals from the system bus 14 to decode these signals and control which word line signal is asserted as well as perform any necessary column de-multiplexing (not illustrated) in order to access the appropriate data values stored within the array 16. Buffer circuitry 30 is provided within the data path to the array 16 and may, for example, be used to store a complete row of data values, thereby reducing the number of accesses which need to be made to the array 16 itself.

The integrated circuit memory 10 includes a clock signal input 32 receiving a clock signal CLK and a chip enable signal input 34 receiving a chip enable signal CEN. The chip enable signal CEN is supplied to both clock control circuitry 36 and power control circuitry 38. The clock signal CLK is supplied to the clock control circuitry 36. If the chip enable signal CEN indicates that the integrated circuit memory 10 is active, then the clock control circuitry 36 is responsive to a rising edge of the clock signals CLK to generate a plurality of control signals which control the various parts of integrated circuit memory 10 to perform the memory access specified by the address signals and the transaction signals received by the decoder 28. If the chip enable signal CEN indicates that integrated circuit memory 10 is inactive, then the clock control circuitry 36 blocks generation of the control signals and is non-responsive to the rising edge of the clock signal CLK.

The power control circuitry 38 is responsive to the chip enable signal CEN to control power gating of various portions of integrated circuit memory 10. In this example, the power control circuitry 38 switches the word line drivers 24, the sense amplifiers 22 and the buffer circuitry 30 between a low power state and an operating state. In the low power state, the word line drivers 24, the sense amplifiers 22 and the buffer circuitry 30 are not able to operate and consume less power (e.g. suffer less power leakage) than when they are operational in the operating state. The word line drivers 24 are illustrated as being connected to power rails 40, 42 via power supply circuitry 44, 46 composed of power gating headers 44 and power gating footers 46. The power gating headers 44 comprise one or more gates switched by the power control circuitry 38 between a conductive and a non-conductive state to selectively isolate the word line driver circuitry 24 from the power rail 40 when it is desired to switch the word line driver circuitry 24 from an operating state to a low power state. The power gating footers 46 may be similarly formed and serve to selectively isolate the word line driver circuitry 24 from the ground power rail 42 under control of the power control circuitry 38. Similar power gating headers 44 and power gating footers 46 may be used to switch the sense amplifiers 22 and the buffer circuitry 30 between their low power state and their operating state.

The word line driver circuitry 24, the sense amplifiers 22 and the buffer circuitry 30 are configured such that the time taken to switch between the low power state and the operating state does not unduly impact the chip enable setup time normally associated with enabling and disabling the integrated circuit memory 10. The characteristics controlled include balancing the in-rush current required to drive the associated capacitive loads of these circuit elements as they are switched between their low power state and their operating state against having switch-on delay which does not excessively lengthen the chip enable signal, e.g. increases the chip setup time by less than thirty percent.

Figure 3:
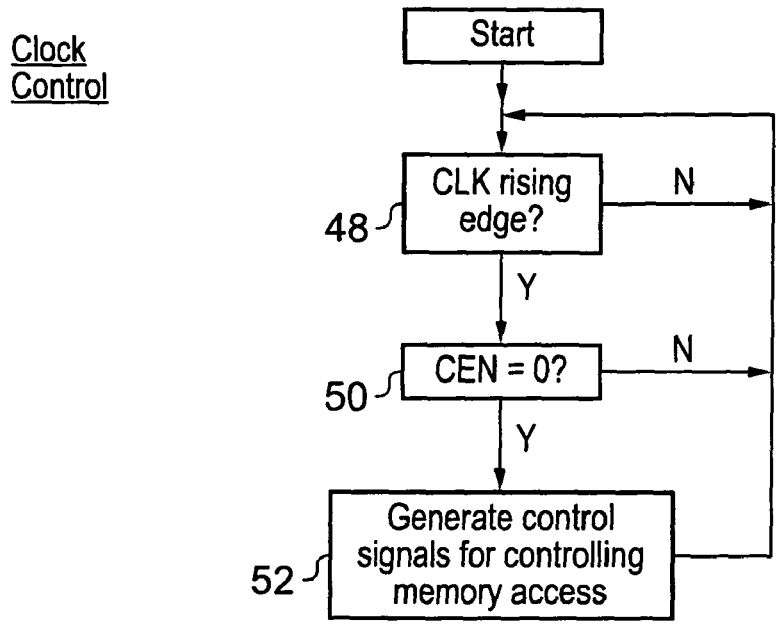
FIG. 3 is a flow diagram schematically illustrating the operation of clock control circuitry within an integrated circuit memory.

FIG. 3 is a flow diagram schematically illustrating the operation of the clock control circuitry 36. At step 48 processing waits until a rising edge in the clock signal CLK is detected. When such a rising edge is detected, a determination is made at step 50 as to whether or not the chip enable signal CEN indicates that the integrated circuit memory 10, 12 is currently disabled or enabled. If the chip enable signal CEN is low (CEN=0), then this indicates that the integrated circuit memory 10, 12 is active and processing proceeds to step 52 where the clock control circuitry 36 generates the various control signals for controlling the memory access specified by the received address signals and transaction signals. The various control signals include self time clocks for controlling the operation of the various circuit blocks (e.g. address decoders, sense amplifiers, etc) within the integrated circuit memory 10, 12. If the determination at step 50 is that the chip enable signal CEN indicates that the integrated circuit memory 10, 12 is disabled, then processing returns to step 48.

Figure 4:
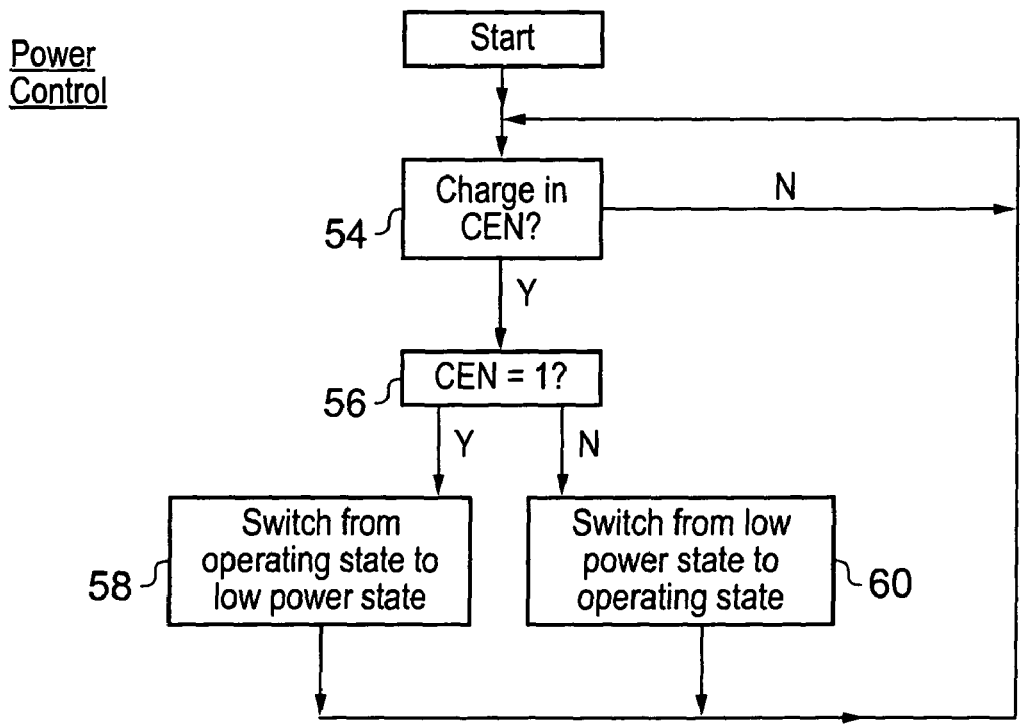
FIG. 4 is a flow diagram schematically illustrating the operation of power control circuitry within an integrated circuit memory.

FIG. 4 is a flow diagram schematically illustrating the operation of the power control circuitry 38. At step 54 processing waits until there is a change in the chip enable signal CEN. When a change is detected, processing proceeds to step 56 where a determination is made as to whether or not the new value of the chip enable signal indicates that the integrated circuit memory 10, 12 is inactive (CEN=1). If the determination is that the chip enable signal indicates that new state of the integrated circuit memory 10, 12 is disabled (i.e. CEN=1), then processing proceeds to step 58 where the power control circuitry 38 generates the power control signals supplied to different portions 24, 44, 46, 22, 30 of the integrated circuit memory 10, 12 to switch those portions from the operating state to the low power state. If the determination at step 58 is that the new state of the integrated circuit memory 10, 12 is one in which the integrated circuit memory 10, 12 is active (i.e. CEN=0), then step 60 serves to switch from the low power state to the operating state using the power control circuitry 38 to generate the appropriate associated power control signals. Processing thereafter returns to step 54.

Figure 5:
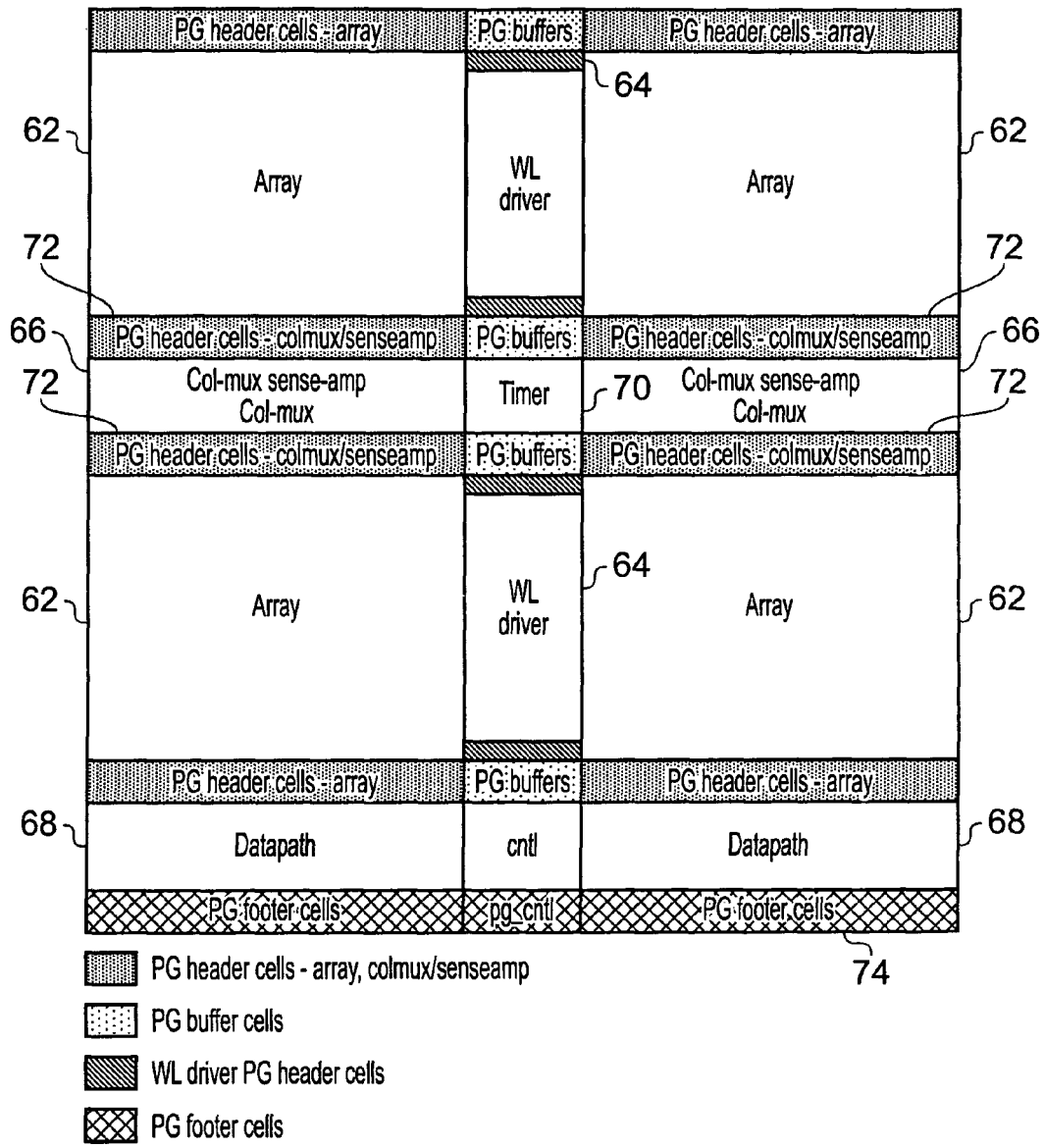
FIG. 5 schematically illustrates part of another integrated circuit memory showing different portions of that integrated circuit memory which may be subject to power control in response to a chip enable signal.

FIG. 5 schematically illustrates part of an integrated circuit memory 10, 12 including multiple arrays 62 of bit cells storing data values. Peripheral circuitry for accessing these data values includes word line driver circuitry 64, column multiplexers and sense amplifiers 66, data path circuitry 68 and timer circuitry 70. Power gating headers are associated with these peripheral circuit elements and serve to switch these to a low power state when the chip enable signal CEN indicates that the integrated circuit memory 10, 12 concerned is disabled. Power gating footer cells 74 shared between all of the circuit elements of the integrated circuit memory 10, 12 are also provided and may be used when switching to the low power state.

It will be appreciated that the arrangement of FIG. 5 is only one example of how an integrated circuit memory 10, 12 utilizing the present techniques may be formed.

Figure 6:
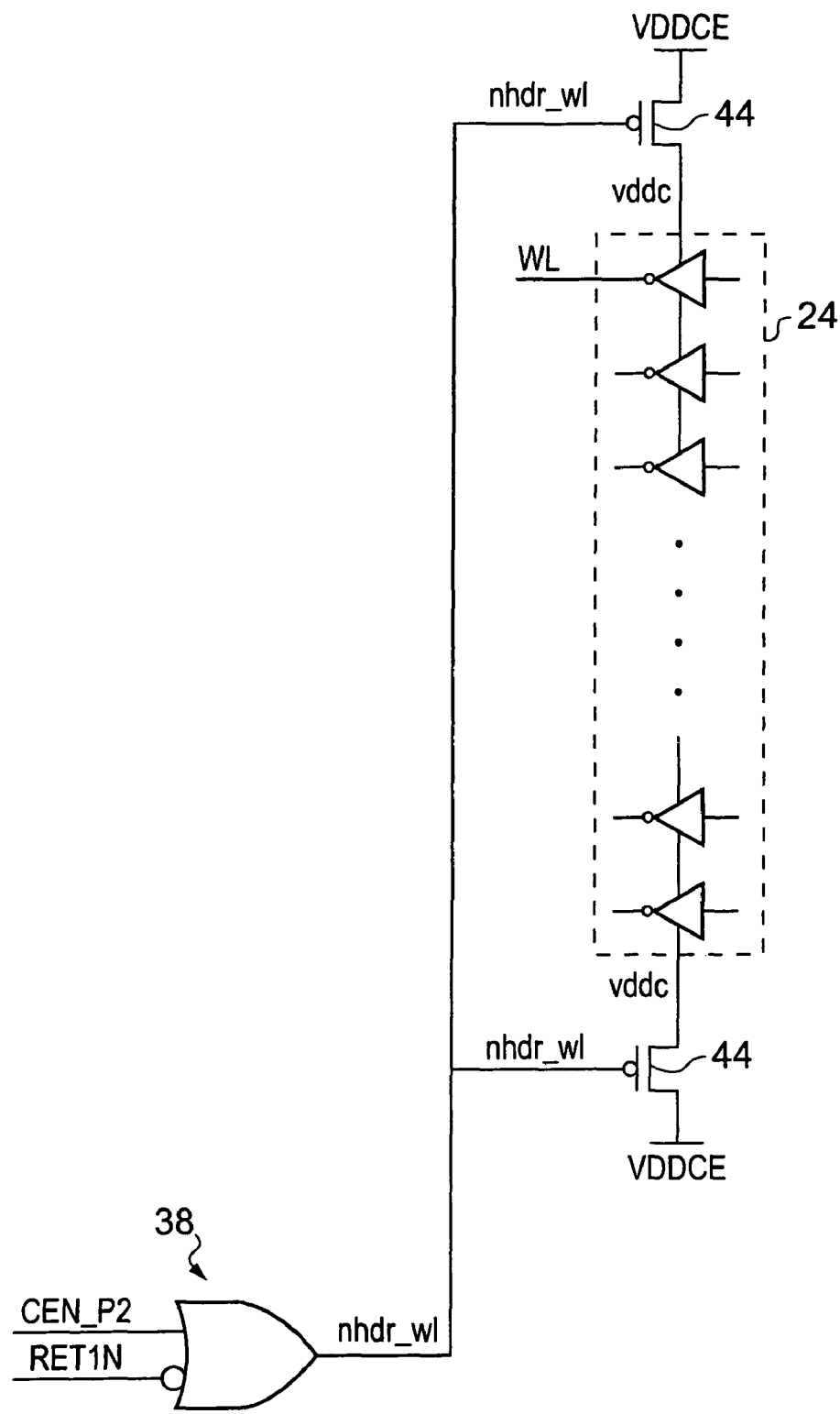
FIG. 6 schematically illustrates how word line driver circuitry may be subject to power control in response to a chip enable signal.

FIG. 6 schematically shows how word line driver circuitry 24 comprising an array of word line drivers may be subject to power gating using a power gating header 44 switched by power control circuitry 38 in the form of an OR-gate with one input being the chip enable signal CEN. When the chip enable signal CEN is asserted to indicate that the integrated circuit memory 10, 12 containing the word line driver circuitry 24 is inactive, the output from the OR-gate switches off the power gating headers 44 thereby isolating the word line driver circuitry 24 from the power rail carrying the $V_{DD}$ power supply. This reduces the power consumed by the word line driver circuitry 24 when integrated circuit memory 10, 12 is disabled, such as by reducing the leakage current through the word line driver circuitry 24. When the chip enable signal CEN indicates that the integrated circuit memory 10, 12 is to be switched from the disabled state to the enabled state, the output from the OR-gate switches on the power gating headers 44 rendering them conductive and accordingly restoring the power supply to the word line driver circuitry 24 a switching this to an operating state after a delay period corresponding to the chip enable setup time.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit memory comprising:
    a clock signal input configured to receive a clock signal;
    a chip enable signal input configured to receive a chip enable signal;
    memory circuitry configured to store data values;
    clock control circuitry coupled to said memory circuitry, said clock signal input and said chip enable signal input and configured such that:
        (i) when said chip enable signal has a first value, said clock control circuitry is responsive to said clock signal to generate one or more control signals for controlling an access operation for accessing one or more data values stored within said memory circuitry; and
        (ii) when said chip enable signal has a second value, said clock control circuitry blocks generation of said one or more control signals in response to said clock signal; and
    power control circuitry coupled to said memory circuitry and said chip enable signal input and configured such that:
        (i) when said chip enable signal has said second value, said power control circuitry controls power supply circuitry of at least a portion of said memory circuitry to switch said portion of said memory circuitry to a low power state in which said portion of said memory circuitry is not able to operate; and
        (ii) when said chip enable signal has said first value, said power control circuitry controls said power supply circuitry of said portion of said memory circuitry to switch said portion of said memory circuitry to an operating state in which said portion of said memory circuitry is able to operate and having a higher power consumption than said low power state.

2. An integrated circuit memory as claimed in claim 1, wherein said memory circuitry comprises an array of bit cells and word line driver circuitry configured to generate word line signals to control access to respective rows of bit cells within said array, said portion of said memory circuitry including said word line driver circuitry.

3. An integrated circuit memory as claimed in claim 1, wherein said memory circuitry comprises an array of bit cells with bit lines extending therethrough and sense amplifier circuitry coupled to said bit lines for sensing data values stored within said bit cells, said portion of said memory circuitry including said sense amplifier circuitry.

4. An integrated circuit memory as claimed in claim 1, comprising a plurality of address signal inputs configured to receive address signals specifying a memory address to be accessed and a plurality of transaction control signal inputs configured to receive transaction signals specifying an access operation to be performed for data values corresponding to said memory address, wherein said memory circuitry is configured such that when said chip enable signal has said second value, said memory circuitry does not respond to said address signal and said transaction signals.

5. An integrated circuit memory as claimed in claim 1, wherein when in said low power state said portion of said memory circuitry has a lower power leakage than when in said operating state.

6. An integrated circuit memory as claimed in claim 1, wherein said power supply circuitry comprises at least one of:
    (i) one or more header gates coupled to a first power rail and configured to selectively couple said portion of said memory circuitry to said first power rail under control of said chip enable signal; and
    (ii) one or more footer gates coupled to a second power rail and configured to selectively couple said portion of said memory circuitry to said second power rail under control of said chip enable signal.

7. An integrated circuit memory as claimed in claim 1, wherein said portion of said memory circuitry is configured such that switching said portion of said memory circuitry from said low power state to said operating state extends a set up time of said chip enable signal by less than 30 percent.

8. An integrated circuit memory comprising:
    clock signal input means for receiving a clock signal;
    chip enable signal input means for receiving a chip enable signal;
    memory means for storing data values;
    clock control means for generating one or more control signals and coupled to said memory means, said clock signal input means and said chip enable signal input means, wherein:
        (i) when said chip enable signal has a first value, said clock control means is responsive to said clock signal to generate said one or more control signals for controlling an access operation for accessing one or more data values stored within said memory means; and
        (ii) when said chip enable signal has a second value, said clock control means blocks generation of said one or more control signals in response to said clock signal; and
    power control means for controlling a power supply to at least a portion of said memory means and coupled to said chip enable signal input means, wherein:
        (i) when said chip enable signal has said second value, said power control means controls said power supply to said portion of said memory means to switch said portion of said memory means to a low power state in which said portion of said memory means is not able to operate; and
        (ii) when said chip enable signal has said first value, said power control means controls said power supply of said portion of said memory means to switch said portion of said memory means to an operating state in which said portion of said memory means is able to operate and having a higher power consumption than said low power state.

9. A method of controlling an integrated circuit memory comprising the steps of:
    receiving a clock signal;
    receiving a chip enable signal;
    storing data values within memory circuitry;
    in response to said clock signal:
        (i) when said chip enable signal has a first value, generating one or more control signals for controlling an access operation for accessing one or more data values stored within said memory circuitry; and (ii) when said chip enable signal has a second value, blocking generation of said one or more control signals; and controlling a power supply to at least a portion of said memory circuitry such that:
  (i) when said chip enable signal has said second value, switching said portion of said memory circuitry to a low power state in which said portion of said memory circuitry is not able to operate; and
  (ii) when said chip enable signal has said first value, switching said portion of said memory circuitry to an operating state in which said portion of said memory circuitry is able to operate and having a higher power consumption than said low power state.

10. A method as claimed in claim 9, wherein said memory circuitry comprises an array of bit cells and word line driver circuitry configured to generate word line signals to control access to respective rows of bit cells within said array, said portion of said memory circuitry including said word line driver circuitry.

11. A method as claimed in claim 9, wherein said memory circuitry comprises an array of bit cells with bit lines extending therethrough and sense amplifier circuitry coupled to said bit lines for sensing data values stored within said bit cells, said portion of said memory circuitry including said sense amplifier circuitry.

12. A method as claimed in claim 9, comprising receiving a plurality address signals specifying a memory address to be accessed and a plurality transaction signals specifying an access operation to be performed for data values corresponding to said memory address, wherein said memory circuitry is configured such that when said chip enable signal has said second value, said memory circuitry does not respond to said address signal and said transaction signals.

13. A method as claimed in claim 9, wherein when in said low power state said portion of said memory circuitry has a lower power leakage than when in said operating state.

14. A method as claimed in claim 9, wherein said power supply is controlled using at least one of:
  (i) one or more header gates coupled to a first power rail and configured to selectively couple said portion of said memory circuitry to said first power rail under control of said chip enable signal; and
  (ii) one or more footer gates coupled to a second power rail and configured to selectively couple said portion of said memory circuitry to said second power rail under control of said chip enable signal.

15. A method as claimed in claim 9, wherein said portion of said memory circuitry is configured such that switching said portion of said memory circuitry from said low power state to said operating state extends a set up time of said chip enable signal by less than 30 percent.

\* \* \* \* \*